(12) United States Patent
Henze

(10) Patent No.: US 6,676,843 B2
(45) Date of Patent: Jan. 13, 2004

(54) MAGNETICALLY PATTERNING CONDUCTORS

(75) Inventor: Richard H Henze, San Carlos, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 264 days.

(21) Appl. No.: 09/843,484

(22) Filed: Apr. 26, 2001

(65) Prior Publication Data

US 2002/0158044 A1 Oct. 31, 2002

(51) Int. Cl.$^7$ ................................................ B44C 1/22
(52) U.S. Cl. .......................... 216/22; 216/48; 216/62; 216/67; 216/75
(58) Field of Search .......................... 216/22, 62, 67, 216/75, 48

(56) References Cited

U.S. PATENT DOCUMENTS

| | | | | |
|---|---|---|---|---|
| 5,221,417 A | * | 6/1993 | Basavanhally | 216/22 |
| 6,174,449 B1 | * | 1/2001 | Alwan et al. | 216/42 |
| 6,238,582 B1 | * | 5/2001 | Williams et al. | 216/22 |
| 6,391,419 B1 | * | 5/2002 | Katayama et al. | 428/65.3 |
| 6,433,944 B1 | * | 8/2002 | Nagao et al. | 360/16 |

* cited by examiner

Primary Examiner—Nadine G. Norton
Assistant Examiner—Binh X. Tran

(57) ABSTRACT

A method for magnetic patterning of conductors includes imparting a pattern of magnetization into a magnetic material and depositing a substance onto the magnetic material that preferentially gathers according to the pattern in the magnetic material. A set of conductors are then formed such that the substance controls a pattern for the conductors.

15 Claims, 4 Drawing Sheets

MAGNETICALLY PATTERNING CONDUCTORS

BACKGROUND OF THE INVENTION

1. Field of Invention

The present invention pertains to the field of forming conductors. More particularly, this invention relates to magnetically patterning conductors.

2. Art Background

A typical integrated circuit includes a set of conductors which are arranged in a pattern according to the electrical interconnects needed in the integrated circuit. Memories, for example, usually include a set of top conductors and a set of bottom conductors which are arranged in a pattern that provides access to storage cells.

The conductors in an integrated circuit are usually formed on a silicon substrate using photo-lithographic techniques. Similar photo-lithographic techniques are commonly used to form conductors on flexible substrates such as plastic. Unfortunately, the costs associated with photo-lithography usually increase as the density of circuit features including conductors increases. It may be desirable to provide an alternative method for forming conductors that yields high density without the increased costs that are imposed with high-density photo-lithography.

SUMMARY OF THE INVENTION

A method is disclosed for magnetic patterning of conductors. The method includes imparting a pattern of magnetization into a magnetic material and depositing a substance onto the magnetic material that preferentially gathers according to the pattern in the magnetic material. A set of conductors are then formed such that the substance controls the pattern of the conductors.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
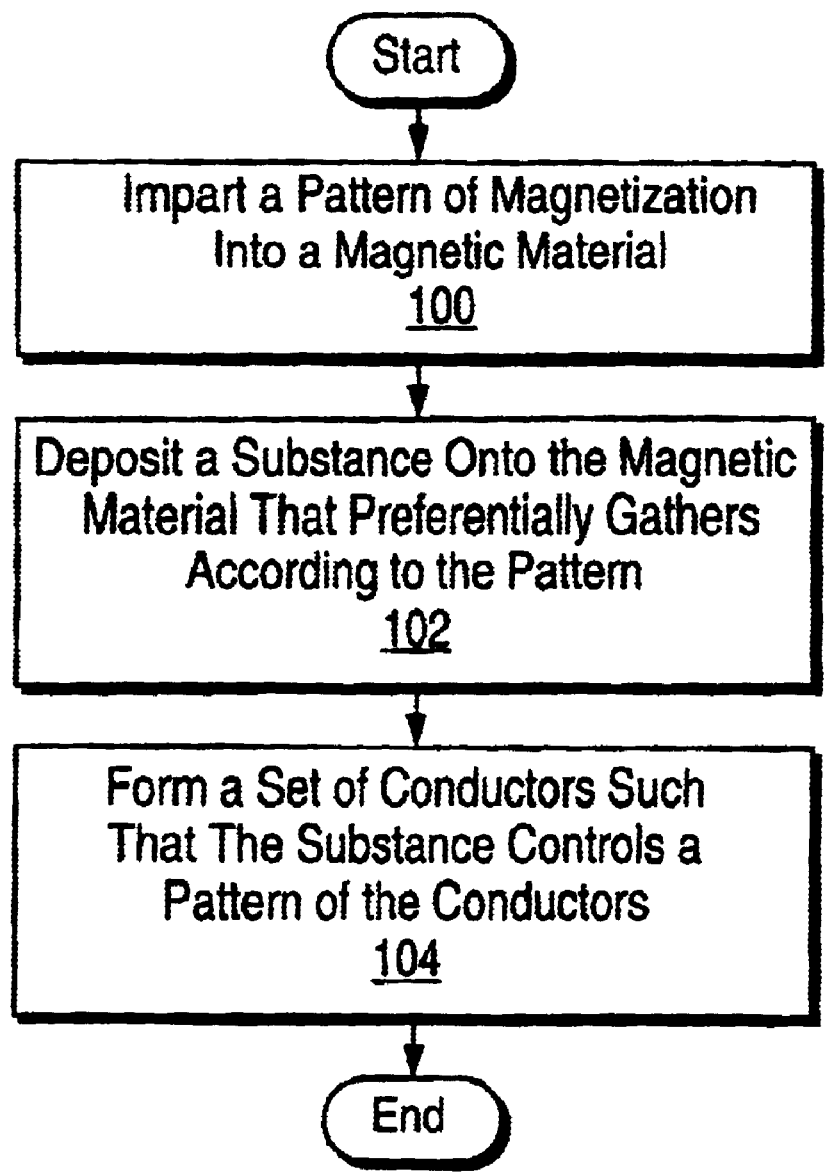
FIG. 1 illustrates a method for forming a set of conductors according to the present techniques.

FIG. 1 illustrates a method for magnetic patterning of conductors according to the present techniques.

At step 100, a pattern of magnetization is imparted into a magnetic material. In one embodiment, the magnetic material into which the pattern is imparted at step 100 is contained on a magnetic tape.

The pattern imparted at step 100 may be any pattern. The pattern may be adapted to a particular application for the conductors. Examples of applications include the conductors associated with the bit lines and/or word lines of a memory.

At step 102, a substance is deposited onto the magnetic material that preferentially gathers, i.e. agglomerates, according to the pattern imparted at step 100. This substance protects the areas of the magnetic material in a pattern that correspond to a desired pattern for the conductors being formed.

At step 104, a set of conductors are formed such that the substance controls a pattern for the conductors.

In one embodiment, the regions of the magnetic material 12 not protected by the substance deposited at step 102 are removed at step 104. The remaining magnetic material protected by the substance provides the desired conductors.

Figure 2:
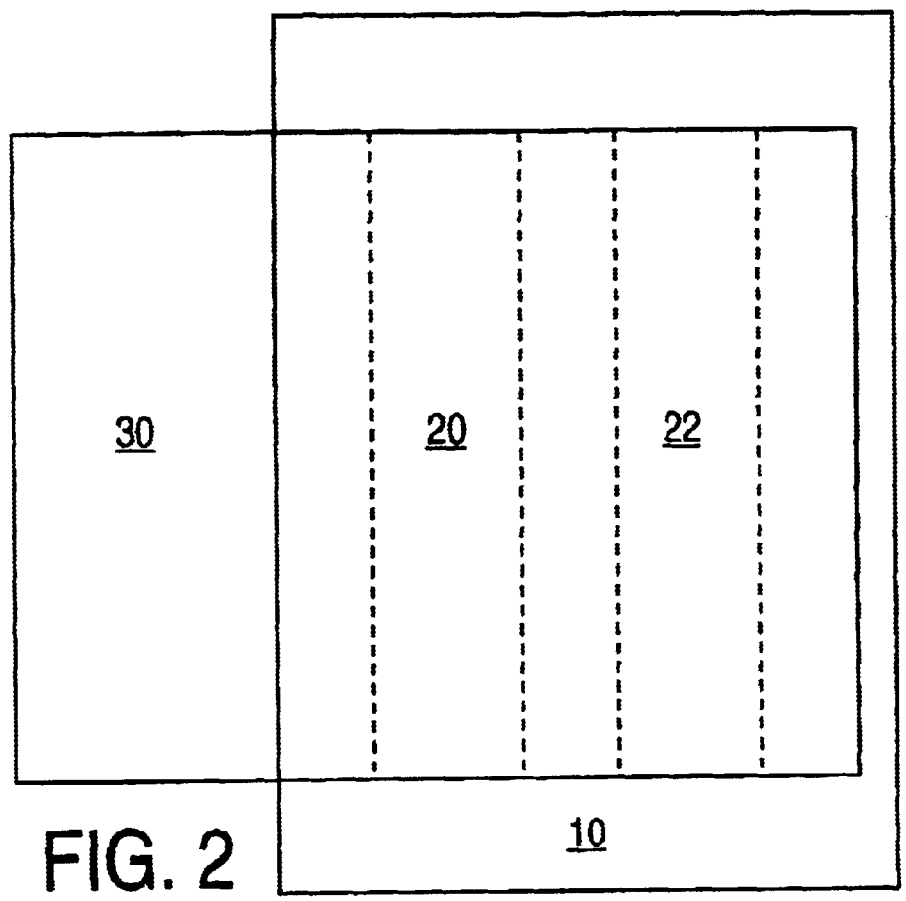
FIG. 2 shows an example pattern imparted into a magnetic material in one embodiment.

FIG. 2 shows an example pattern imparted into a magnetic material at step 100 in one embodiment. In this embodiment, the magnetic material is on a magnetic tape 10. In this example, the pattern is imparted by magnetic fields generated in a pair of gaps 20–22 of a magnetic write head 30.

The gaps 20–22 formed in the write head 30 have a pattern and dimensions which are adapted to a particular arrangement for the conductors being formed. The write head 30 may have a pattern of multiple gaps. Electrical current in the write head 30 may be pulsed multiple times to repeat the magnetization pattern resulting from the head gaps.

Figure 3:
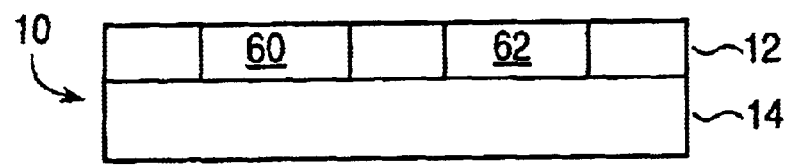
FIG. 3 shows a cross-section view of a magnetic tape with the example pattern.

FIG. 3 shows a cross-section view of the magnetic tape 10 after step 100. The magnetic tape 10 includes the magnetic material 12 and a substrate 14. The pattern of magnetizations in the magnetic material 12 includes a pair of regions 60–62 of reversed magnetization. The magnetic domains in the regions 60–62 are reversed in comparison to the remainder of the magnetic material 12 as a result of the magnetic fields applied via the gaps 20–22.

In one embodiment, the magnetic tape 10 is a metal evaporated (ME) tape upon which the magnetic material 12 may be a thin deposited magnetic film such as cobalt. Alternatively, the magnetic material 12 may be bound particulate magnetic material such as iron. The substrate 14 may be a plastic such as polyethylene terephthalate (PET), polyethylene naphthalate (PEN), or polyimide (PI). The magnetic material 12 if bound particulate media is unlikely to serve well as the final conductor.

Figure 4:
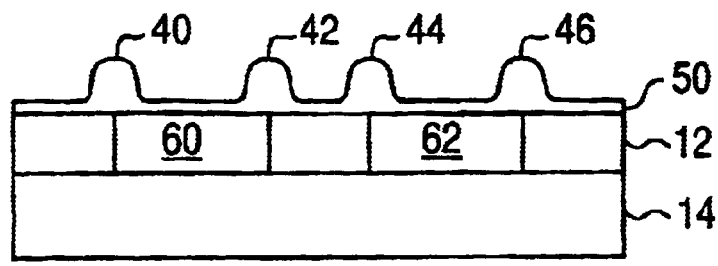
FIG. 4 shows a substance deposited on the magnetic material that agglomerates according to the pattern of magnetization.

FIG. 4 shows a substance 50 deposited on the magnetic material 12 at step 102 in this example. The substance 50 preferentially gathers according to the pattern defined by the regions 60–62. This yields a set of regions 40–46 formed by the agglomeration of the substance 50 over areas of the magnetic material 12 that are field reversal regions between the magnetization in the regions 60–62 and the magnetization in the regions of the magnetic material 12 outside of the regions 60–62.

In one embodiment, the substance 50 deposited at step 102 is a bitter-fluid which has small ferromagnetic particles on the order of 10–100 nanometers suspended in a solvent. The bitter-fluid may be applied using a coating process. The solvent then evaporates leaving the thicker regions 40–46 of small magnetic particles. The regions 40–46 provide a mask for forming conductors from the magnetic material 12.

At step 104 in this example, the regions of the magnetic material 12 not protected by the regions 40–46 of the substance 50 are removed. The unprotected magnetic material 12 may be removed at step 104 using a step such as ion milling. Alternatively, a reactive dry etch such as reactive ion etch may be used at step 104.

In another alternative, a wet etch which preferentially does not dissolve the substance 50 may be performed at step 104. A wet etch may be performed at step 104 which dissolves the thinner regions of the substance 50 and which preferentially dissolves the magnetic material 12 in comparison to dissolving the substance 50 once the etch reaches the magnetic material 12.

Figure 5:
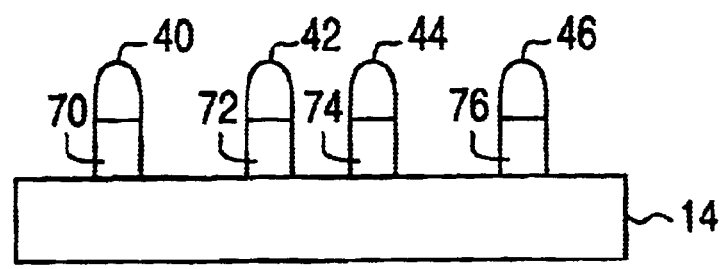
FIG. 5 shows the conductor regions that remain after removal of unprotected areas of the magnetic material.

FIG. 5 shows the magnetic tape 10 after step 104. The removal of unprotected areas of the magnetic material 12 yields a set of conductor regions 70–76 in the magnetic material 12. The conductor regions 70–76 provide the pattern of desired conductors. Some of the substance 50 in the regions 40–46 remain after the step 104. A solvent or a subsequent dry etch may used to remove the remaining regions 40–46 of the substance 50.

Figure 6:
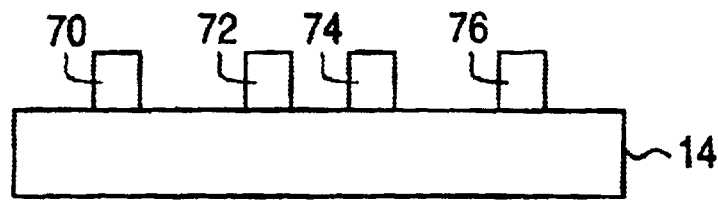
FIG. 6 shows the resulting conductors after the removal of the remnants of the substance.

FIG. 6 shows the resulting conductors 70–76 formed on the substrate 14 after the removal of the substance 50.

The magnetic tape 10 with the conductors 70–76 thereon may be employed in a variety of circuits. For example, the conductors 70–76 may be employed as a set of top conductors in a memory. A set of orthogonal bottom conductors may be formed on another magnetic tape using the present techniques. Any of a variety of known techniques may be used to form memory cells at crossing points between the top and bottom conductors contained on the magnetic tapes.

Figure 7A:
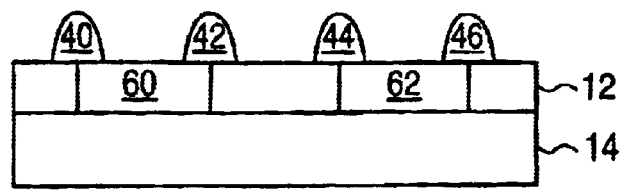
FIGS. 7a–7d show an alternative method for forming conductors.
Figure 7B:
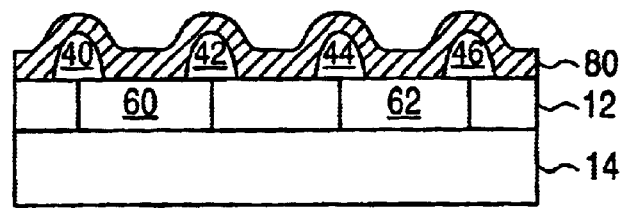
Figure 7C:
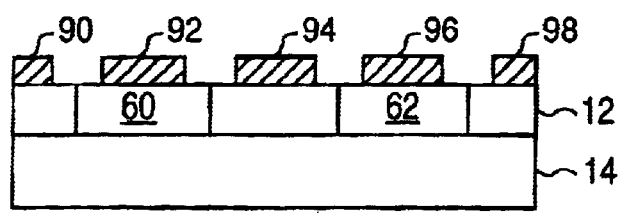
Figure 7D:
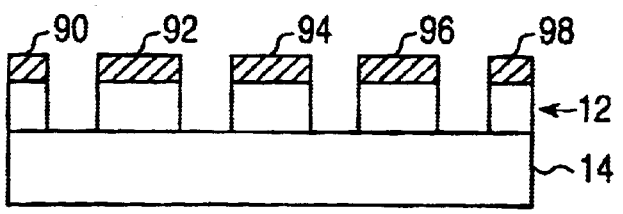

FIGS. 7a–7d show an alternative step 104 for forming conductors. In this alternative step 104, some of the substance 50 is removed to expose the magnetic material 12 as shown in FIG. 7a. A metalization layer 80 is then deposited on the remaining regions 40–46 of the substance 50 and the exposed regions of the magnetic material 12 as shown in FIG. 7b. The remaining regions 40–46 along with corresponding regions of the metalization layer 80 are then removed. As shown in FIG. 7c, this leaves a set of of metal lines 90–98 which are remnants of the metalization layer 80. The magnetic material 12 not protected by the metal lines 90–98 is removed, for example by an etched back, to yield the structures shown in FIG. 7d.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for magnetically patterning a set of conductors, comprising the steps of:
   imparting a pattern of magnetization into a magnetic material;
   depositing a substance onto the magnetic material that preferentially gathers according to the pattern of magnetization; and
   forming the conductors such that the substance controls a pattern for the conductors by removing the magnetic material not protected by the substance.

2. The method of claim 1, wherein the step of removing the magnetic material comprises the step of performing a bombarding dry etch.

3. The method of claim 1, wherein the step of removing the magnetic material comprises the step of performing a reactive dry etch.

4. The method of claim 1, wherein the step of removing the magnetic material comprises the step of performing a wet etch.

5. The method of claim 1, wherein the step of removing the magnetic material comprises the step of performing a wet etch that dissolves a set of thinner regions of the substance and that preferentially dissolves the magnetic material in comparison to the substance.

6. The method of claim 1, wherein the step of imparting the pattern comprises the step of imparting the pattern using a magnetic write head having a gap pattern that corresponds to the pattern of magnetization.

7. The method of claim 1, further comprising the steps of removing the substance from the magnetic material.

8. The method of claim 1, wherein the magnetic material is a magnetic film.

9. The method of claim 1, wherein the magnetic material is bound particulate magnetic material.

10. The method of claim 1, wherein the substance is a fluid comprising small magnetic particles suspended in a solvent.

11. The method of claim 1, wherein the magnetic material is held on a plastic substrate.

12. The method of claim 7, wherein the step of depositing the substance comprises the steps of:
    coating a fluid onto the magnetic material such that magnetic suspended particles in the fluid preferentially gather; and
    evaporating the solvent from the magnetic material.

13. The method of claim 1, wherein the step of forming the conductors comprises the steps of:
    removing a portion of the substance to expose a set of areas of the magnetic material according to the pattern;
    depositing a layer of metalization on the substance and the magnetic material;
    forming a set of metal lines by removing the substance;
    removing the magnetic material not protected by the metal lines.

14. The method of claim 13, wherein the step of depositing a layer of metalization on the substance and the magnetic material comprises the step of depositing a layer of metalization on the substance and exposed areas of the magnetic material.

15. The method of claim 13 wherein the step of forming a set of metal lines by removing the substance comprises the step of forming the metal lines by preferentially removing the substance and the overlaying metalization in the regions where the overlaying metalization covers the substance.

* * * * *